United States Patent
Udono et al.

(10) Patent No.: US 11,935,974 B2
(45) Date of Patent: Mar. 19, 2024

(54) SEMICONDUCTOR MATERIAL, INFRARED LIGHT RECEIVING ELEMENT AND METHOD FOR PRODUCING SEMICONDUCTOR MATERIAL

(71) Applicants: Ibaraki University, Mito (JP); JX METALS CORPORATION, Tokyo (JP)

(72) Inventors: Haruhiko Udono, Hitachi (JP); Toshiaki Asahi, Tokyo (JP)

(73) Assignees: IBARAKI UNIVERSITY, Mito (JP); JX METALS CORPORATION, Tokyo (JP)

( * ) Notice: Subject to any disclaimer, the term of this patent is extended or adjusted under 35 U.S.C. 154(b) by 295 days.

(21) Appl. No.: 17/293,403

(22) PCT Filed: May 23, 2019

(86) PCT No.: PCT/JP2019/020559
§ 371 (c)(1),
(2) Date: May 12, 2021

(87) PCT Pub. No.: WO2020/100330
PCT Pub. Date: May 22, 2020

(65) Prior Publication Data
US 2022/0013675 A1     Jan. 13, 2022

(30) Foreign Application Priority Data
Nov. 13, 2018 (JP) ................. 2018-213281

(51) Int. Cl.
*H01L 31/032* (2006.01)
*C30B 29/52* (2006.01)
*H01L 31/18* (2006.01)

(52) U.S. Cl.
CPC ............ *H01L 31/032* (2013.01); *C30B 29/52* (2013.01); *H01L 31/18* (2013.01)

(58) Field of Classification Search
CPC ... C30B 29/52; H01L 31/032; H01L 31/0321; H01L 31/102; H01L 31/18
See application file for complete search history.

(56) References Cited

U.S. PATENT DOCUMENTS 10,047,426 B2 *  8/2018  Kim ................. C22C 23/02
2008/0317621 A1 * 12/2008  Aoki ................. C22C 23/00
                                              420/402

(Continued)

FOREIGN PATENT DOCUMENTS

JP   2006-269818 A   10/2006
JP   2016-219666 A   12/2016

(Continued)

OTHER PUBLICATIONS

International Preliminary Report on Patentability (Forms PCT/IB/338, and PCT/IPEA/409) for International Application No. PCT/JP2019/020559, dated May 14, 2021.

(Continued)

*Primary Examiner* — Jaehwan Oh
(74) *Attorney, Agent, or Firm* — Birch, Stewart, Kolasch & Birch, LLP

(57) ABSTRACT

Provided is a semiconductor material having improved oxidation resistance. The semiconductor material has a single crystal represented by the following composition formula:

$Mg_2Sn \cdot Zn_a$     Composition formula:

in which, a is a Zn content of from 0.05 to 1 at % relative to $Mg_2Sn$.

7 Claims, 5 Drawing Sheets

(56) References Cited

U.S. PATENT DOCUMENTS

| | | | | |
|---|---|---|---|---|
| 2012/0070248 | A1* | 3/2012 | Kuwabara | C22F 1/00 |
| | | | | 411/378 |
| 2014/0116580 | A1* | 5/2014 | Kim | C22F 1/06 |
| | | | | 148/420 |
| 2016/0043070 | A1* | 2/2016 | Momo | H01L 29/66742 |
| | | | | 257/296 |
| 2017/0301845 | A1 | 10/2017 | Tada et al. | |

FOREIGN PATENT DOCUMENTS

| | | |
|---|---|---|
| JP | 2017-132655 A | 8/2017 |
| JP | 2018-59160 A | 4/2018 |
| WO | WO 2016/052272 A1 | 4/2016 |

OTHER PUBLICATIONS

Kaneda et al., "Influence of Impurity Doping on the Oxidation Properties of Melt-Grown $Mg_2Si$ (II)," Proceedings of the 65th Spring Meeting of the Japan Society of Applied Physics, Mar. 5, 2018, p. 12-254, with English translation (3 pages total).

Extended European Search Report for corresponding European Application No. 19883358.4, dated Jun. 23, 2022.

Russian Office Action for corresponding Russian Application No. 2021116564, dated Jul. 18, 2022, with English translation.

Akiyama et al., "Fabrication of $Mg_2Si$ pn-junction Photodiode with Shallow Mesa-structure and Ring Electrode", Proc. Asia-Pacific Conf. on Semiconducting Silicides and Related Materials 2016, JJAP Conf. Proc., vol. 5, (2017), https://doi.org/10.7567/JJAPCP.5.011102, pp. 011102-1-011102-5.

Choi et al., "Doping Effects on Thermoelectric Properties in the $Mg_2Sn$ System", Journal of Electronic Materials, vol. 41, No. 6, Jun. 2012, pp. 1071-1076.

Daitoku et al., "Fabrication and Characterization of $Mg_2Si$ pn-junction Photodiode with a Ring Electrode", Proc. Int. Conf. and Summer School on Advanced Silicide Technology 2014, JJAP Conf. Proc., vol. 3, (2015), 2015 The Japan Society of Applied Physics, pp. 011103-1-011103-4.

International Search Report for PCT/JP2019/020559 (PCT/ISA/210) dated Jul. 23, 2019.

Midonoya et al., "P-Type Impurity Doping and Electrical Property Evaluation of $Mg_2Sn$ Monocrystals", Extended Abstracts of the 54th Meeting of JSAP (Spring 2009, University of Tsukuba), No. 3, 2009, p. 1423.

Written Opinion of the International Searching Authority for PCT/JP2019/020559 (PCT/ISA/237) dated Jul. 23, 2019.

\* cited by examiner

SEMICONDUCTOR MATERIAL, INFRARED LIGHT RECEIVING ELEMENT AND METHOD FOR PRODUCING SEMICONDUCTOR MATERIAL

FIELD OF THE INVENTION

The present invention relates to a semiconductor material, an infrared light receiving element, and a method for producing a semiconductor material.

BACKGROUND OF THE INVENTION

With recent dramatic technological innovations in relation to artificial intelligence (AI) and the like, research and development of systems that perform automatic monitoring and controlling instead of human eyes and hands are being energetically carried out. In such automatic monitoring and controlling systems, an appropriate response operation is determined based on various input information such as light, temperature, and voice, so that a hardware for detecting an input signal will be a key device that plays an important role in the entire system. Especially in terms of detecting light input signals, advanced automatic monitoring and automatic controlling can be achieved by using a device that serves as the human eyes or, in some cases, can detect information in areas that cannot be perceived by the human eyes.

Examples of the devices that detect light input signals include those having elements that convert light signals into electrical signals which can be electronically processed. An example of the basic element is a photo detection element with a semiconductor material.

The photo detecting element with the semiconductor material has different detectable wavelength regions depending on bandgaps of the semiconductor materials. In order to perform advanced control that can be used for automatic monitoring at night and automatic driving of automobiles, input information in relation to light in the infrared light region is required in addition to information on light in the visible light region and images. Therefore, there is a strong demand for infrared light receiving elements and devices that can detect light input with higher sensitivity in the infrared light region, and active studies and developments using various semiconductor materials are being promoted.

As a material used for the photo detecting elements, a crystalline material of magnesium silicide ($Mg_2Si$), which is a compound semiconductor composed of magnesium (Mg) and silicon (Si), has been proposed, and certain results have been obtained (Non-Patent Literatures 1 and 2).

CITATION LIST

[Non-Patent Literature 1] T. Akiyama et al., Proc. Asia-Pacific Conf. Semicond. Silicides Relat. Mater. 2016, JJAP Conf. Proc. Vol. 5, 2017, pp. 011102-1-011102-5
[Non-Patent Literature 2] K. Daitoku et al., Proc. Int. Conf. Summer School Adv. Silicide Technol. 2014, JJAP Conf. Proc. Vol. 3, 2015, pp. 011103-1-011103-4

SUMMARY OF THE INVENTION

Technical Problem

Conventionally, research and development of semiconductor materials having a good light absorption coefficient have been carried out for infrared light receiving element applications. However, the semiconductor material may react with the air in the atmosphere and may be oxidized and deteriorated, which causes problems such as reduction of device performance.

The present disclosure is to solve the technical problems as described above. An object of the present disclosure is to provide a semiconductor material having improved oxidation resistance, and another object is to provide an infrared light receiving element including the semiconductor material, and yet another object is to provide a method for producing the semiconductor material.

Solution to Problem

The present inventors have studied various compounds as semiconductor materials that can solve the above problems, and have focused on $Mg_2Sn$, which has been generally known to be useful as a material for thermoelectric conversion elements based on its characteristics. As a result of intensive studies, the present inventors have found that the material is also useful as an infrared light receiving element material, and that the doping of the material with Zn leads to improved oxidation resistance.

Based on such findings and ideas, the present disclosure provides the following inventions:

1) A semiconductor material, the semiconductor material having a single crystal represented by the following composition formula:

$$Mg_2Sn \cdot Zn_a \quad \text{Composition formula:}$$

in which, a is a Zn content of from 0.05 to 1 at % relative to $Mg_2Sn$.

2) The semiconductor material according to 1), wherein a is from 0.1 to 0.5 at % in the formula.

3) An infrared light receiving element comprising the semiconductor material according to 1) or 2).

4) A method for producing the semiconductor material according to 1) or 2), comprising doping with Zn in a raw material preparation step and/or a synthesis step.

5) The method for producing the semiconductor material according to 4), wherein the method carries out either:
  a direct melting method for filling a reaction vessel with a raw material obtained in the raw material preparation step, heating the raw material at a temperature more than or equal to a melting point of a product to cause synthesis, and then cooling it after the synthesis to obtain the product; or
  an inert gas atmosphere pressure melting method for heating and melting the raw material in a pressurized reaction vessel filled with the raw material to cause synthesis, and then cooling it after the synthesis to obtain a product.

6) The method for producing the semiconductor material according to 4), wherein the method carries out a solid-liquid melting method for filling the reaction vessel with the raw material obtained in the raw material preparation step, heating the raw material at a temperature less than or equal to a melting point of $Mg_2Sn$ to cause solid-liquid synthesis, and cooling it after the synthesis to obtain a product, and then optionally sintering the product.

7) The method for producing the semiconductor material according to 1) or 2), wherein the semiconductor material is produced by a direct melting method having the following steps (1) to (5):
(1) a raw material preparation step of preparing a particulate raw material comprising Mg, Sn and Zn;

(2) a raw material filling step of filling a reaction vessel with the raw material prepared in the step (1);
(3) a synthesis step of heating the entire reaction vessel to cause a melting chemical reaction;
(4) a step of cooling a melt produced in the step (3) to deposit a $Mg_2Sn \cdot Zn_a$ single crystal; and
(5) a step of removing the $Mg_2Sn \cdot Zna$ single crystal deposited in the step (4) from the reaction vessel.

Advantageous Effects of Invention

According to the present disclosure, it is possible to provide a semiconductor material having improved oxidation resistance.

DETAILED DESCRIPTION OF THE INVENTION (Semiconductor Material)

The semiconductor material according to the present disclosure is a semiconductor material having a single crystal represented by the following composition formula:

Composition formula: $Mg_2Sn \cdot Zn_a$ in which, a is a Zn content of from 0.05 to 1 at % relative to $Mg_2Sn$.

The semiconductor material according to the present disclosure is produced by doping $Mg_2Sn$ with Zn to form a single crystal as a whole. That is, Zn is not present at grain boundaries of $Mg_2Sn$, but present in a homogeneous solid solution state in the crystal. This would be because Mg is replaced by the doped Zn in the crystal. Since $Mg_2Sn \cdot Zn_a$ is thus the single crystal, it has no crystal grain boundary and has aligned crystal orientations. Therefore, it has effects capable of precisely controlling electrical and optical properties of the crystal, as well as capable of precise processing such as cutting, polishing, and etching. The semiconductor material is suitable as a substrate for infrared light receiving elements.

In the semiconductor material according to the present disclosure, a is a Zn content of from 0.05 to 1 at % relative to $Mg_2Sn$, in the composition formula: $Mg_2Sn \cdot Zn_a$. If the Zn content is less than 0.05 at %, sufficient oxidation resistance may not be obtained. Further, if the Zn content is more than 1 at %, the presence of Zn in a solid solution state in $Mg_2Sn$ will be difficult, which may cause a problem that Zn which is not capable of solid solution is segregated as a fine deposit, or the crystal is polycrystallized. In the composition formula: $Mg_2Sn \cdot Zn_a$, a is more preferably from 0.1 to 0.5 at %.

The semiconductor material according to the present disclosure has substantially the same carrier concentration as that of a material consisting only of $Mg_2Sn$, but has an improved light absorption coefficient, so that light receiving performance can be improved when used as an infrared light receiving element, because $Mg_2Sn$ is doped with Zn in the amount of from 0.05 to 1 at %. For example, in Examples as described later, a light absorption coefficient of a photon energy at 0.35 eV is increased about 5 times by doping with 0.5 at % of Zn.

The semiconductor material according to the present disclosure has substantially the same carrier concentration as that of the material consisting only of $Mg_2Sn$, but the semiconductor material according to the present disclosure can have a reduced energy gap (Eg), because $Mg_2Sn$ is doped with Zn in the amount of from 0.05 to 1 at %. As a result, a wavelength of detectable light is extended and shifted to a long wavelength band, which will be more useful when used for the infrared light receiving element. For example, in Examples as described later, the Eg is reduced from 0.25 eV to 0.21 eV by doping with 0.5 at % of Zn. This can allow the maximum detectable wavelength (cutoff wavelength) to be extended from about 5  to about 6 μm, when the infrared light detector is produced.

The semiconductor material according to the present disclosure may be composed of a single crystal represented by the composition formula: $Mg_2Sn \cdot Zn_a$, or may have inevitable impurities mixed in the single crystal represented by $Mg_2Sn \cdot Zn_a$. The inevitable impurities are impurities which are inevitably mixed in the raw materials and the production steps, and which contain elements such as B, C, N, Na, Al, Si, P, Ca, Cr, Mn, Fe, Ge, As, and Sb in a total content of 0.5 at % or less.

(Infrared Light Receiving Element)

An infrared light receiving element can be produced using the semiconductor material according to the present disclosure. The infrared light receiving element can employ, for example, the semiconductor material according to the present disclosure as a p-type or n-type light absorption region used for p-n junction photodiodes, although not particularly limited thereto. According to the semiconductor material of the present disclosure, it is possible to provide a semiconductor material having improved oxidation resistance. Further, the light absorption coefficient near a forbidden band energy is increased, so that the light detection sensitivity can be increased. Further, the energy gap (Eg) can be reduced up to about 0.21 eV, thereby producing an infrared light receiving element that can expand the receivable cutoff wavelength to about 6 μm, and can detect infrared light having a longer wavelength. Therefore, the production of the infrared light receiving element including the semiconductor material can allow deterioration of various devices for sensing and imaging in the infrared light region to be suppressed. Accordingly, significant contribution can be expected to technologies such as various image analysis and image diagnosis, as well as automatic monitoring and control technologies using them, and industrial fields using those technologies.

(Method for Producing Semiconductor Material)

The method for producing the semiconductor material according to the present disclosure is not particularly limited, but the following methods can be preferably used.

That is, the method carries out either: a direct melting method for filling a reaction vessel with a raw material obtained in a raw material preparation step, heating the raw material at a temperature more than or equal to a melting point of a product to cause synthesis, and then cooling it after the synthesis to obtain the product; or an inert gas atmosphere pressure melting method for heating and melting the raw material in a pressurized reaction vessel filled with the raw material to cause synthesis, and then cooling it after the synthesis to obtain a product.

Further, it may carry out a solid-liquid melting method for filling the reaction vessel with the raw material obtained in the raw material preparation step, heating the raw material at a temperature less than or equal to a melting point of $Mg_2Sn$ to cause solid-liquid synthesis, and cooling it after the synthesis to obtain a product, and then optionally carrying out melting synthesis.

The method for producing the semiconductor material according to the present disclosure is characterized by doping with Zn in the raw material preparation step and/or the synthesis step.

According to these methods, the single crystal of the semiconductor material according to the present disclosure can be easily produced by using a known production method.

Preferably, for example, the single crystal of the semiconductor material according to the present disclosure can be produced by a direct melting method having the following steps (1A) to (5A):
 (1A) a raw material preparation step of preparing a raw material containing Mg particles and Sn particles or Mg—Sn alloy particles;
 (2A) a raw material filling step of doping the raw material prepared in the step (1A) with Zn and filling a reaction vessel with the raw material;
 (3A) a synthesis step of heating the entire reaction vessel to cause a chemical reaction;
 (4A) a step of cooling a melt produced in the step (3A) to deposit a single crystal; and
 (5A) a step of removing the single crystal deposited in the step (4A) from the reaction vessel.

The Zn doped in the step (2A) can be fed as single metal particulate material. It can also be fed as an alloy such as MgZn.

The semiconductor material according to the present disclosure may be produced by a direct melting method having the following steps (1B) to (5B):
 (1B) a raw material preparation step of preparing a particulate raw material comprising Mg, Sn and Zn;
 (2B) a raw material filling step of filling a reaction vessel with the raw material prepared in the step (1B);
 (3B) a synthesis step of heating the entire reaction vessel to cause a melting chemical reaction;
 (4B) a step of cooling a melt produced in the step (3B) to deposit a $Mg_2Sn·Zn_a$ single crystal; and
 (5B) a step of removing the $Mg_2Sn·Zn_a$ single crystal deposited in the step (4B) from the reaction vessel.

The raw materials Mg and Sn used in the present invention may preferably employ highly purified and chunk-shaped particles having a purity of 4N (99.99%) or more, and more preferably 5N (99.999%) or more, and more preferably 6N (99.99999%), and having an average particle size of from about 2 to 3 mm. In general, Mg and Sn are mixed such that the total of the raw materials Mg particles and Sn particles has an element ratio of 2:1. Further, Zn is mixed such that the atomic concentration of Zn is from 0.5 to 10 at % relative to $Mg_2Sn$.

A pressure during the heating may be atmospheric pressure, but heating in an Ar gas at about 3 atm is desirable. A heating temperature is 770.5° C. (the melting point of $Mg_2Sn$) to 850° C., and for example, the heat treatment is performed for about 15 minutes to 14 hours in total. At a temperature of 770.5° C. or more, Mg and Sn are melted to form an Mg—Sn melt, and Zn is homogeneously melted therein. In this case, an amount of Zn added to the raw material is about ten times the target Zn content, although it varies depending on crystal synthesis conditions such as a cooling rate. For example, in Examples as described later, the Zn contents in the single crystal are 0.5 at % and 1 at %, respectively, for cases where Zn is added to the raw material having Mg:Sn=2:1 in amounts of 5 at % and 10 at %, when the crystal is grown at a cooling rate of 20° C./h.

The cooling of the obtained melt is not particularly limited, and a known cooling device can be used and a known cooling method can be used. After synthesis, the melt is cooled to obtain a single crystal. The cooling may be natural cooling, forced cooling, or a combination thereof.

It is preferable to cause chemical reaction of Mg with Sn with stirring, because it can allow a single crystal to be more uniformly produced in a short period of time. The stirring may be carried out using a known stirring device and a known stirring method, although not particularly limited.

Further, the method for producing the semiconductor material according to the present disclosure may be a method for producing a semiconductor material by a chemical vapor deposition method (CVT method) having the following steps (1C) to (5C):
 (1C) a raw material preparation step of preparing Mg, Sn, Zn, or a $Mg_2Sn$ polycrystalline raw material obtained by synthesizing these;
 (2C) a raw material filling step of filling a reaction vessel with the raw material prepared in the step (1C) together with a transporting material (CI, Br, I, etc.);
 (3C) a synthetic step of heating the reaction vessel to cause a melting chemical reaction;
 (4C) a step of cooling the melt produced in the step (3C) to deposit a $Mg_2Sn·Zn_a$ single crystal; and
 (5C) a step of removing the $Mg_2Sn·Zn_a$ single crystal deposited in the step (4C) from the reaction vessel.

In the synthesis step (3C) as described above, the reaction vessel is placed in an electric furnace having a temperature gradient and maintained with heating. In this case, the raw material side is maintained at a higher temperature and the crystal growth side is maintained at a lower temperature, whereby the transport material and the raw material are allowed to react and vaporized in the higher temperature part, and the raw material substances are transported to the lower temperature part in the gas phase. In the lower temperature part, the raw material in the gas phase reacts and grows as crystals due to supersaturation. In general, the temperature during heating is 770.5° C. or less, which is the melting point of $Mg_2Sn$ in the higher temperature part, but it may be higher than the melting point. The lower temperature part where the crystal is grown must be maintained at a temperature of 770.5° C. or less.

Further, to make an infrared light detector, a single crystal film of the semiconductor material according to the present disclosure can be used in the light absorption region of the detector. In this case, the single crystal film can be produced by a generally known semiconductor film deposition technique such as a molecular beam epitaxy method (MBE method), a metalorganic chemical vapor deposition method (MOCVD method), and a sputtering deposition method.

In the MBE method, generally, Mg, Sn, and Zn are simultaneously fed by molecular beam obtained by evaporating them in a vacuum vessel, and the composition ratio is adjusted to deposit $Mg_2Sn·Zn_a$ on a substrate such as $Mg_2Sn$. During the deposition, the substrate is generally heated. The heating temperature is generally 100° C. or higher and lower than or equal to the melting point of Mg.

By the heating, the molecules deposited on the substrate react to grow a single crystal $Mg_2Sn \cdot Zn_a$ film.

In the MOCVD method, generally, organometallic gases containing Mg, Sn, and Zn are simultaneously fed in a reaction vessel, and the composition ratio is adjusted to deposit $Mg_2Sn \cdot Zn_a$ on a substrate such as $Mg_2Sn$. During the deposition, the substrate is generally heated. The heating temperature is generally 100° C. or higher and lower than or equal to the melting point of Mg. By the heating, the organometallic gases react on the substrate to grow a single crystal $Mg_2Sn \cdot Zn_a$ film.

In the sputter deposition method, generally, a solid target containing Mg, Sn, and Zn is sputtered in a reaction vessel with Ar ions to feed sputter molecules, and the composition ratio is adjusted to deposit $Mg_2Sn \cdot Zn_a$ on a substrate such as $Mg_2Sn$. During the deposition, the substrate is generally heated. The heating temperature is generally 100° C. or higher and lower than or equal to the melting point of Mg. By the heating, sputter molecules react on the substrate to grow a single crystal $Mg_2Sn \cdot Zn_a$ film.

It should be noted that the descriptions of the above embodiments are for explaining the present invention, and they are not intended to limit or restrict the scope of the inventions recited in the claims. Further, the configuration of each part of the present invention is not limited to the above embodiments, and various modifications may be made within the technical scope recited in the claims.

EXAMPLES

Hereinafter, the technical contents of the present disclosure will be specifically described based on Examples. The following Examples are merely specific examples for facilitating the understanding of the technical contents of the present disclosure, and the technical scope of the present invention is not limited by these specific Examples.
(Production of Semiconductor Material)

In an alumina crucible (alumina tammann tube) having an inner diameter of 12 mmφ and a length of 11 cm were placed Mg particles having a purity of 4N [chunk material (an average particle size of 2 to 3 mm) from RARE METALLIC Co., Ltd.], Sn particles having a purity of 5N [chunk material] (an average particle size of 2 to 3 mm) from OSAKA ASAHI METAL MFG CO., LTD.], and zinc [particulate material (a particle size of 1 mm), a purity of 99.99999% from OSAKA ASAHI METAL MFG CO., LTD.].

The crucible was then sealed in a quartz ampoule together with an Ar gas at 560 Torr, and it was placed in an electric furnace (resistance heating furnace), and heated to 780° C. (display temperature) over 1 hour. After further heating it at the same temperature for 14 hours to melt it, the temperature of the electric furnace was decreased to a temperature of 300° C. at a cooling rate of 20° C./h to grow crystals. The furnace was then naturally cooled, and at the time when the temperature reached room temperature, the crucible was removed from the electric furnace to obtain a semiconductor material according to Example.

Further, a semiconductor material according to Comparative Example was produced by the same method as that of Example as described above, with the exception that Zn was not added as the raw material mixture.
(Composition of Semiconductor Material)

The composition of the semiconductor material according to Example was measured using a fluorescent X-ray analyzer. As a result, the composition was $Mg_2Sn \cdot Zn_{0.5}$ (i.e., the Zn content was 0.5 at % relative to $Mg_2Sn$). Further, the composition of the semiconductor material according to another Example was measured by the same method. As a result, it was $Mg_2Sn \cdot Zn_1$ (i.e., the Zn content was 1 at % relative to $Mg_2Sn$).

On the other hand, the composition of the semiconductor material according to Comparative Example was also measured with the same method, and as a result, it was $Mg_2Sn$.
(Powder X-ray Diffraction Measurement)

Figure 1:
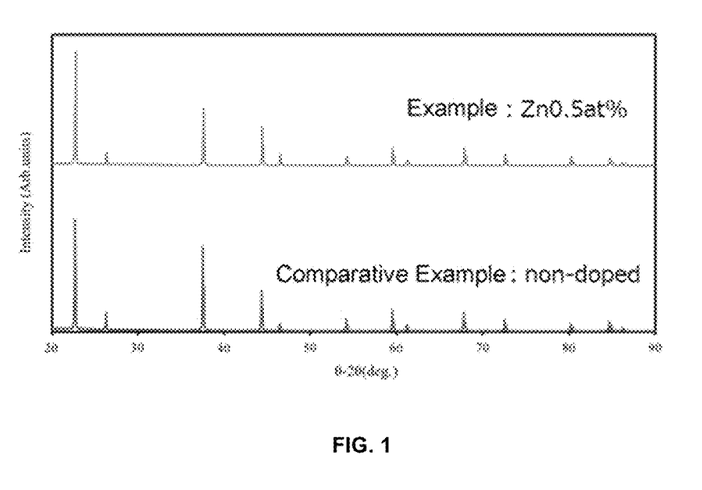
FIG. 1 is a graph showing powder X-ray diffraction measurement results according to Example of the present disclosure.

The resulting semiconductor materials were subjected to powder X-ray diffraction measurement. As a result, Example of the composition formula $Mg_2Sn \cdot Zn_{0.5}$ (Zn: 0.5 at %) had a peak at a position similar to that of Comparative Example (non-doped) of the composition formula $Mg_2Sn$, as shown in FIG. 1. That is, it is found that the crystal of Example of the composition formula $Mg_2Sn \cdot Zn_{0.5}$ has a single phase as with $Mg_2Sn$, and has no dispersion of Zn at the grain boundaries, and form a single crystal in solid solution in the crystal. The same was true for Example of the composition formula $Mg_2Sn \cdot Zn_1$.
(Observation by SEM-EDX)

Figure 2:
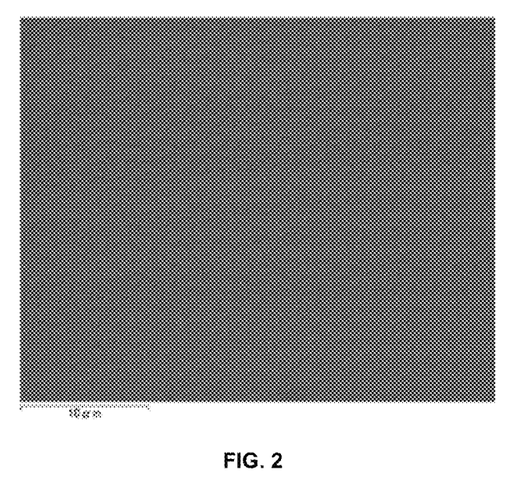
FIG. 2 is a graph showing SEM-EDX measurement results according to Example of the present disclosure.

The cross section of the resulting semiconductor material was observed by SEM-EDX. As a result, the grain boundary of $Mg_2Sn$ was not observed, revealing that it had a homogenous single crystal as shown in FIG. 2. Further, it was confirmed that no minute deposit of the doped Zn was observed, and that the Zn was in homogeneous solid solution in $Mg_2Sn$.
(Measurement of Oxidation Resistance)

Figure 3:
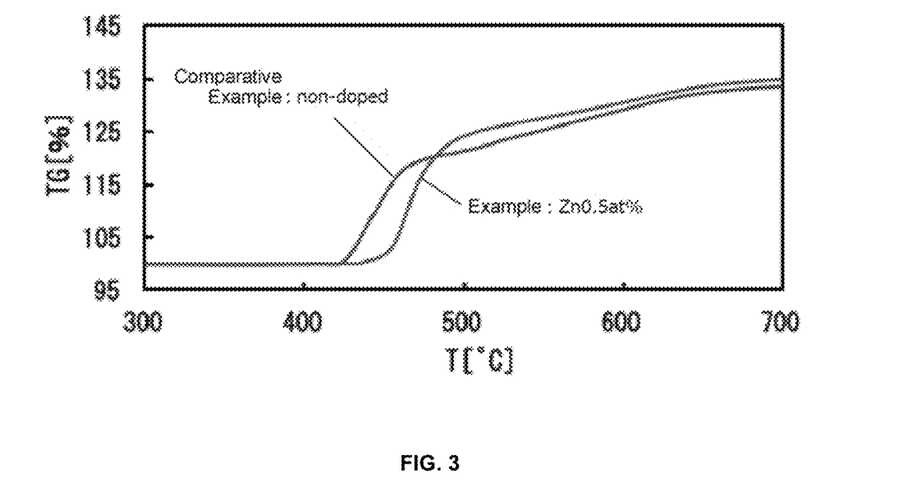
FIG. 3 is a graph showing thermogravimetric measurement results according to Example of the present disclosure.

The resulting semiconductor materials were heated under conditions of an atmospheric flow of 300 ml/min and a temperature rising rate of 10° C./min from room temperature using a commercially available thermogravimetric differential thermal analyzer (TG-DTA), and an increase in weight (% by mass) when reached 700° C. was determined. The test results are shown in FIG. 3. The graph of FIG. 3 shows a percentage of the increase in weight (% by mass) relative to the weight before heating. As can be seen from the graph of FIG. 3, in Example of the composition formula $Mg_2Sn \cdot Zn_{0.5}$ doped with Zn, the threshold temperature at the start of oxidation in TG was increased from about 420° C. to about 450° C. and the progress of oxidation is slow, as compared with Comparative Example that was not doped with Zn. This indicates that Example doped with Zn has improved oxidation resistance.

Figure 4:
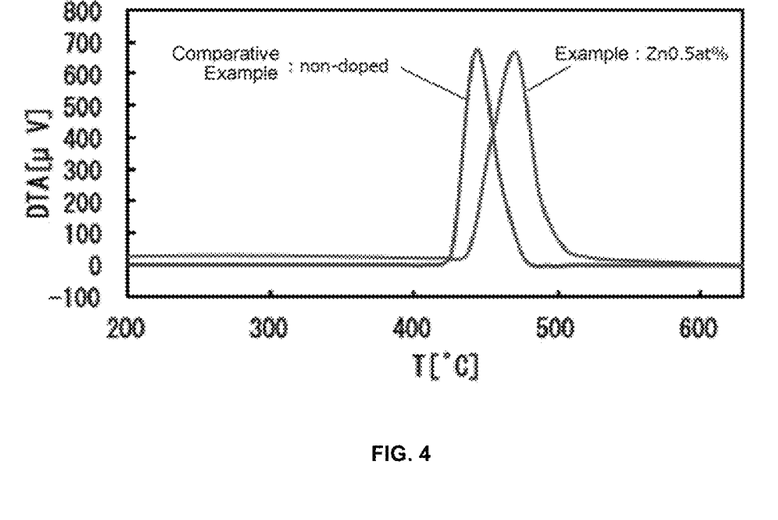
FIG. 4 is a graph showing differential thermal analysis results according to Example of the present disclosure.

Further, the results of the differential thermal analysis are shown in FIG. 4. It is found from FIG. 4 that Example of the composition formula $Mg_2Sn \cdot Zn_{0.5}$ doped with Zn, the DTA peak temperature was increased from 442° C. to 472° C. and it is difficult to be oxidized, as compared with Comparative Example that was not doped with Zn. This indicates that Example doped with Zn has improved oxidation resistance.
(Measurement of Light Absorption Coefficient and Energy Gap)

Figure 5:
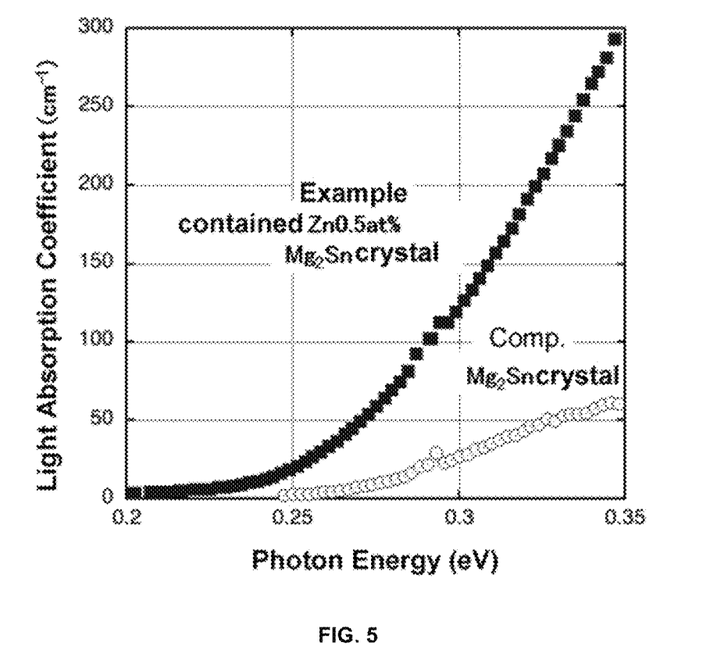
FIG. 5 is a graph showing evaluation results of a light absorption coefficient and an energy gap according to Example of the present disclosure.

The resulting semiconductor materials were subjected to transmission and reflection measurements at room temperature using a commercially available FTIR to evaluate the light absorption coefficient and the energy gap. As shown in FIG. 5, it is found that, in Example of the composition formula $Mg_2Sn \cdot Zn_{0.5}$ doped with Zn, the light absorption coefficient is increased (in particular, the absorption coefficient of the photon energy at 0.35 eV is increased about 5 times), and the energy gap is also reduced from 0.25 eV to 0.21 eV. This indicates that the sensitivity in the infrared light detection is increased and the detectable wavelength is extended, indicating that the semiconductor material according to the present disclosure is a useful material for an infrared light receiving element.

The invention claimed is:

1. A semiconductor material, the semiconductor material having a single crystal represented by the following composition formula:

$$Mg_2Sn \cdot Zn_a \quad \text{Composition formula:}$$

in which, a is a Zn content of from 0.05 to 1 at % relative to $Mg_2Sn$.

2. The semiconductor material according to claim 1, wherein a is from 0.1 to 0.5 at % in the formula.

3. An infrared light receiving element comprising the semiconductor material according to claim 1.

4. A method for producing the semiconductor material according to claim 1, comprising doping with Zn in a raw material preparation step and/or a synthesis step.

5. The method for producing the semiconductor material according to claim 4, wherein the method carries out either:
   a direct melting method for filling a reaction vessel with a raw material obtained in the raw material preparation step, heating the raw material at a temperature more than or equal to a melting point of a product to cause synthesis, and then cooling it after the synthesis to obtain the product; or
   an inert gas atmosphere pressure melting method for heating and melting the raw material in a pressurized reaction vessel filled with the raw material to cause synthesis, and then cooling it after the synthesis to obtain a product.

6. The method for producing the semiconductor material according to claim 4, wherein the method carries out a solid-liquid melting method for filling the reaction vessel with the raw material obtained in the raw material preparation step, heating the raw material at a temperature less than or equal to a melting point of $Mg_2Sn$ to cause solid-liquid synthesis, and cooling it after the synthesis to obtain a product, and then optionally sintering the product.

7. The method for producing the semiconductor material according to claim 1, wherein the semiconductor material is produced by a direct melting method having the following steps (1) to (5):
   (1) a raw material preparation step of preparing a particulate raw material comprising Mg, Sn and Zn;
   (2) a raw material filling step of filling a reaction vessel with the raw material prepared in the step (1);
   (3) a synthesis step of heating the entire reaction vessel to cause a melting chemical reaction;
   (4) a step of cooling a melt produced in the step (3) to deposit a $Mg_2Sn \cdot Zn_a$ single crystal; and
   (5) a step of removing the $Mg_2Sn \cdot Zna$ single crystal deposited in the step (4) from the reaction vessel.

* * * * *